United States Patent
Deng et al.

(10) Patent No.: US 12,550,336 B2
(45) Date of Patent: Feb. 10, 2026

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Jiefang Deng, Hefei (CN); Wei Chang, Hefei (CN); Huihui Li, Hefei (CN); Xiaoguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 498 days.

(21) Appl. No.: 18/151,525

(22) Filed: Jan. 9, 2023

(65) Prior Publication Data

US 2023/0413578 A1    Dec. 21, 2023

(30) Foreign Application Priority Data

Jun. 17, 2022    (CN) .......................... 202210688655.7

(51) Int. Cl.
| | |
|---|---|
| H10B 61/00 | (2023.01) |
| H10N 50/01 | (2023.01) |
| H10N 50/20 | (2023.01) |
| H10N 50/80 | (2023.01) |

(52) U.S. Cl.
CPC ............. *H10B 61/22* (2023.02); *H10N 50/01* (2023.02); *H10N 50/20* (2023.02); *H10N 50/80* (2023.02)

(58) Field of Classification Search
CPC ................................ H10B 61/22; H10N 50/20
See application file for complete search history.

(56) References Cited

U.S. PATENT DOCUMENTS

| | | |
|---|---|---|
| 9,824,739 B2 | 11/2017 | Yang et al. |
| 11,151,439 B2 | 10/2021 | Ouyang et al. |
| 2010/0265616 A1 | 10/2010 | Ohtake et al. |
| 2014/0119109 A1* | 5/2014 | Nagase ................. G11C 11/161 |
| | | 365/158 |
| 2016/0125928 A1 | 5/2016 | Pileggi et al. |

(Continued)

FOREIGN PATENT DOCUMENTS

CN         111293212 A    6/2020

OTHER PUBLICATIONS

Zhao, W.S., et al., "Magnetic Domain-Wall Racetrack Memory for high density and fast data Storage", 2012 IEEE 11th International Conference on Solid-State and Integrated Circuit Technology, Feb. 21, 2013, p. 1-4.

(Continued)

*Primary Examiner* — Shih Tsun A Chou
(74) *Attorney, Agent, or Firm* — Kilpatrick Townsend & Stockton LLP

(57) ABSTRACT

The present disclosure relates to the technical field of semiconductors, and provides a semiconductor structure and a manufacturing method thereof. The semiconductor structure includes: a substrate, including active regions arranged at intervals, where the active region includes a source, a drain, and a channel region; a word line, where the word line is connected to the channel region and extends along a first direction; a bit line, where the bit line is connected to the drain or the source and extends along a second direction, the first direction being different from the second direction; and a magnetic memory cell, connected to the source or the drain.

11 Claims, 16 Drawing Sheets

(56) References Cited

U.S. PATENT DOCUMENTS

2019/0363244 A1    11/2019  Sasaki et al.
2021/0305230 A1*  9/2021  Okajima ............ H01L 25/0655
2023/0335172 A1    10/2023  Hwang

OTHER PUBLICATIONS

Al Bahri, M., et al., "Staggered magnetic nanowire devices for effective domain-wall pinning in racetrack memory", Physical Review Applied, Feb. 8, 2019, pp. 1-7, No. 11, vol. 12.

Yang, Hongxin, et al., "Threshold Switching Selector and 1S1R Integration Development for 3D Cross-point STT-MRAM", 2017 IEEE International Electron Devices Meeting (IEDM), Jan. 25, 2018, pp. 38.1.1-38.1.4.

United States Patent and Trademark office, office action issued in related U.S. Appl. No. 18/161,152 on Oct. 30, 2024.

* cited by examiner

SEMICONDUCTOR STRUCTURE AND MANUFACTURING METHOD THEREOF

CROSS-REFERENCE TO RELATED APPLICATION

This application claims the priority of Chinese Patent Application No. 202210688655.7, submitted to the Chinese Intellectual Property Office on Jun. 17, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

A magnetoresistive random access memory (MRAM) based on a spin transfer torque (STT) is a non-volatile memory that uses a current to change the state of a magnetic tunnel junction (MTJ) to perform write and read operations.

The current MRAM consists of a magnetic domain wall and a magnetic tunnel junction. The state of the magnetic tunnel junction is controlled by one access transistor, and the motion of the magnetic tunnel junction is controlled by two access transistors, so as to control the write and read operations of the magnetic memory cell of the MRAM. In other words, at least three access transistors need to be connected to each magnetic memory cell. However, the fabrication process is complex in forming a memory array, and the access transistors limit the size reduction of the MRAM, which affects the density of the memory array.

SUMMARY

An overview of the subject described in detail in the present disclosure is provided below. This overview is not intended to limit the protection scope of the claims.

The present disclosure provides a semiconductor structure and a manufacturing method thereof.

According to a first aspect of the present disclosure, a semiconductor structure is provided, including:
  a substrate, including active regions arranged at intervals, where the active region includes a source, a drain, and a channel region;
  a word line, where the word line is connected to the channel region and extends along a first direction;
  a bit line, where the bit line is connected to the drain or the source and extends along a second direction, the first direction intersecting with the second direction; and
  a magnetic memory cell, where the magnetic memory cell is connected to the source or the drain.

According to a second aspect of the present disclosure, a method of manufacturing a semiconductor structure is provided, including:
  providing a substrate, where the substrate includes active regions arranged at intervals, and the active region includes a source, a drain, and a channel region;
  forming a word line, where the word line is connected to the channel region and extends along a first direction;
  forming a bit line, where the bit line is connected to the drain or the source and extends along a second direction, the first direction intersecting with the second direction; and
  forming a magnetic memory cell, where the magnetic memory cell is connected to the source or the drain.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Exemplary embodiments of the present disclosure provide a semiconductor structure and a manufacturing method thereof. The semiconductor structure includes a dynamic random access memory (DRAM) structure and magnetic memory cells arranged on the DRAM structure, to implement a non-volatile data storage function on the DRAM structure. Transistors of the DRAM structure are used as transistors for controlling write and read operations of the magnetic memory cell, which simplifies the manufacturing process of the magnetic memory cell. Moreover, the magnetic memory cells are arranged based on an arrangement rule of the DRAM structure, thereby improving the arrangement density of the magnetic memory cells.

Figure 1:
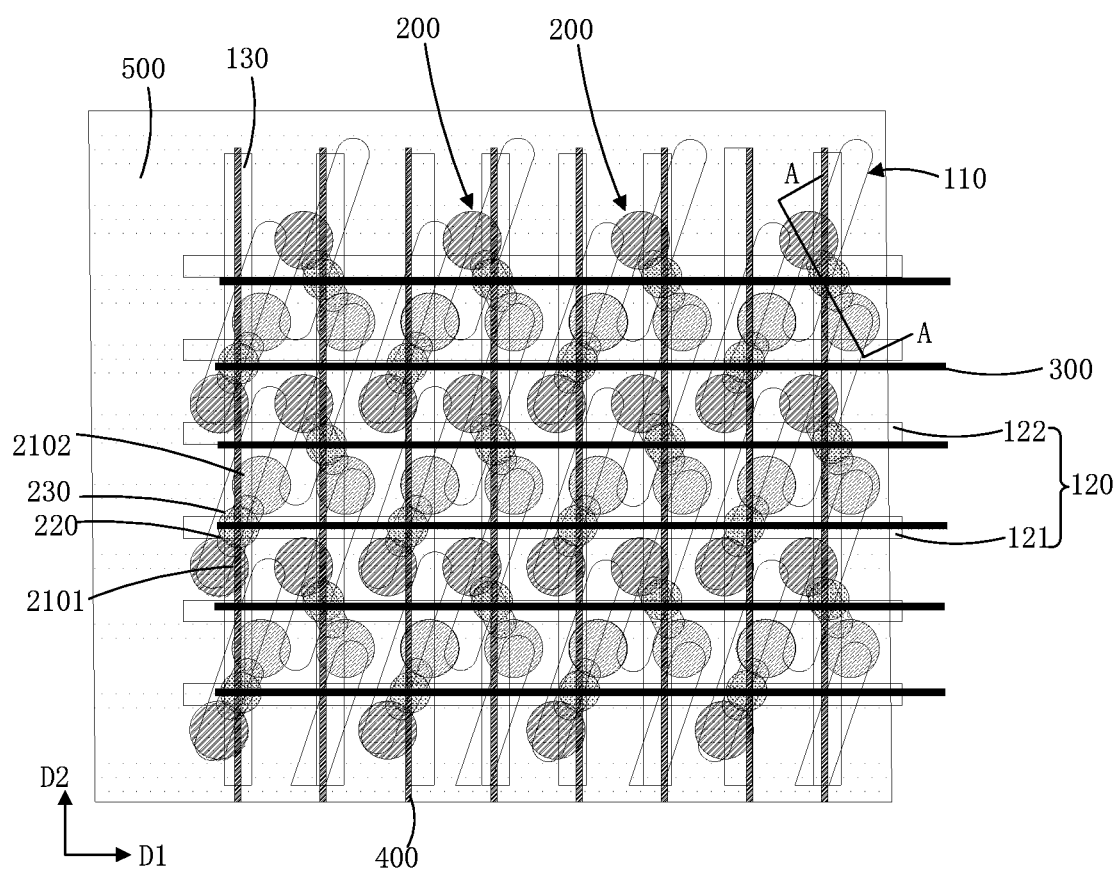
FIG. 1 is a top view of a semiconductor structure according to an exemplary embodiment.
Figure 2:
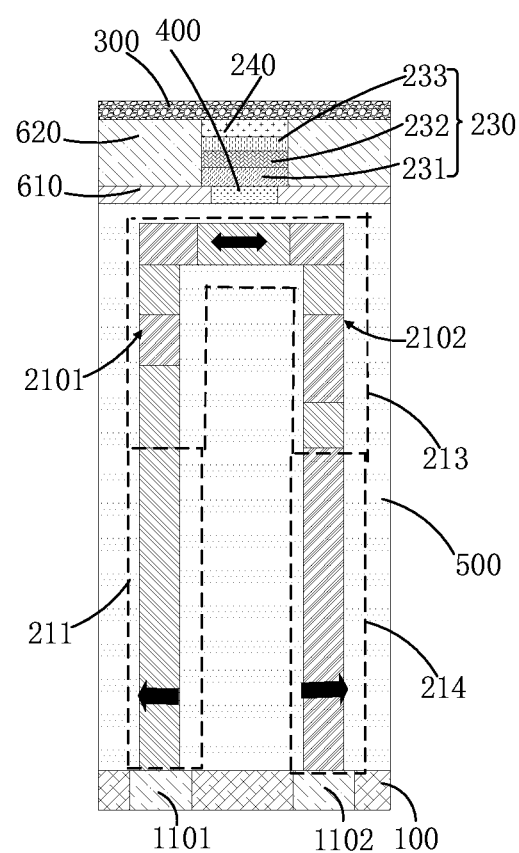
FIG. 2 is a cross-sectional view taken along A-A in FIG. 1.

An exemplary embodiment of the present disclosure provides a semiconductor structure. As shown in FIG. 1 and FIG. 2 with reference to FIG. 9, the semiconductor structure includes a substrate 100, word lines 120, bit lines 130, and magnetic memory cells 200. The substrate 100 includes active regions 110 arranged at intervals. The active region 110 includes a source 111, a drain 112, and a channel region 113. The word line 120 is connected to the channel region 113 and extends along the first direction D1. The bit line 130 is connected to the drain 112 or source 111 and extends along the second direction D2, the first direction D1 intersecting with the second direction D2. The magnetic memory cell 200 is connected to the source 111 or the drain 112.

Figure 9:
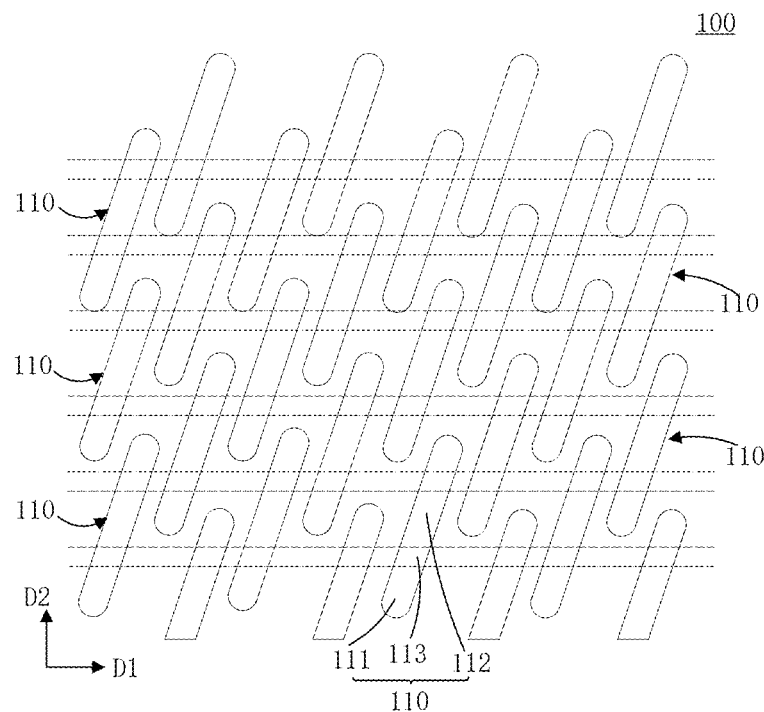
FIG. 9 is a schematic diagram of a substrate according to an exemplary embodiment.
Figure 10:
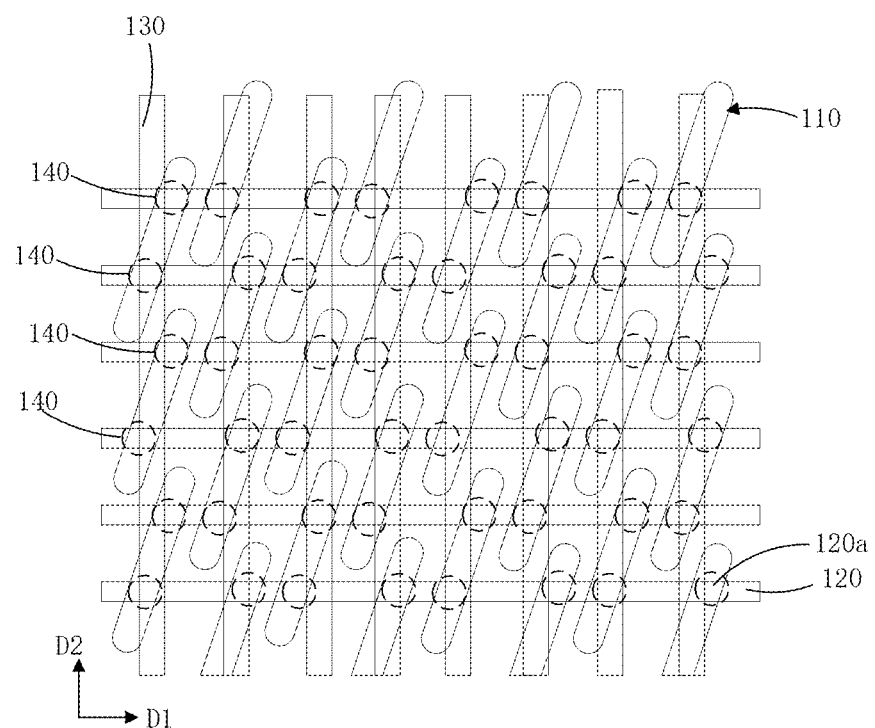
FIG. 10 is a schematic diagram of forming word lines and bit lines according to an exemplary embodiment.

As shown in FIG. 1 and FIG. 2 with reference to FIG. 9 and FIG. 10, the word line 120 is arranged in the active region 110. The word line 120 is connected to a plurality of channel regions 113 of a plurality of active regions 110 along the first direction D1. Each active region 110 is divided into two independent channel regions 113, a drain 112 or source 111 arranged between the channel regions 113, and two sources 111 or drains 112 located at two ends of the active region 110. The two channel regions 113 of the active region 110 are connected to different word lines 120. The bit line 130 extends on the top surface of the substrate 100 along the second direction D2, and is connected to the drain 112 or source 111 between two adjacent word lines 120.

As shown in FIG. 1, the word lines 120, the bit lines 130, and active regions 110 form a planar DRAM structure. Referring to FIG. 10, the word line 120 and the sources 111 and drains 112 of the active regions 110 form a plurality of transistors 140 on the substrate 100. Two transistors 140 are provided in each active region 110, and the transistors 140 connected to the same word line 120 are driven by the same word line 120. The drain 112 or the source 111 of the transistor 140 is connected to the bit line 130. The magnetic memory cell 200 is provided on the substrate 100, and is connected to the source 111 or the drain 112 of the transistor 140.

As shown in FIG. 1 and FIG. 2, the magnetic memory cell 200 includes a first magnetic domain wall 2101, a second magnetic domain wall 2102, a magnetic track 220, a magnetic tunnel junction 230, and a selector 240. The first magnetic domain wall 2101 and the second magnetic domain wall 2102 are arranged parallel on the substrate 100. The magnetic track 220 is located on a top of the first magnetic domain wall 2101 and a top of the second magnetic domain wall 2102, and connects the first magnetic domain wall 2101 and the second magnetic domain wall 2102. The magnetic tunnel junction 230 is located above the magnetic track 220. The magnetic tunnel junction 230 and the magnetic track 220 are connected through magnetic induction. Along a direction away from the magnetic track 220, the magnetic tunnel junction 230 includes a magnetic free layer 231, a non-magnetic spacing layer 232, and a magnetic reference layer 233 that are sequentially arranged. The selector 240 is located on the magnetic tunnel junction 230, and the selector 240 is in contact connection with the magnetic reference layer 233.

As shown in FIG. 1 and FIG. 2, the first magnetic domain wall 2101 is connected to a first word line 121 in the word lines 120, and the second magnetic domain wall 2102 is connected to a second word line 122 in the word lines 120, where the first word line 121 is different from the second word line 122. The first word line 121 being different from the second word line 122 means that the first word line 121 and the second word line 122 are different word lines 120. The first magnetic domain wall 2101 is connected to the source 111 or drain 112 connected with the first word line 121, and the second magnetic domain wall 2102 is connected to the source 111 or drain 112 connected with the second word line 122. The first word line 121 and the second word line 122 are connected to different active regions 110. For example, the first word line 121 is connected to the first active region 1101, and the second word line 122 is connected to the second active region 1102. The first active region 1101 is adjacent to the second active region 1102; the first active region 1101 and the second active region 1102 are connected to different bit lines 130.

In the semiconductor structure of this embodiment, a plurality of magnetic memory cells 200 are arranged on the planar DRAM structure, to implement a non-volatile data storage function on the planar DRAM structure. Moreover, the first magnetic domain wall 2101 and the second magnetic domain wall 2102 of the magnetic memory cell 200 are connected to different word lines 120. The transistors 140 of the planar DRAM structure are used as transistors for the read/write operations of the magnetic memory cell 200, thereby reducing the size of the magnetic memory cell 200 and improving the arrangement density of the magnetic memory cells.

Figure 3:
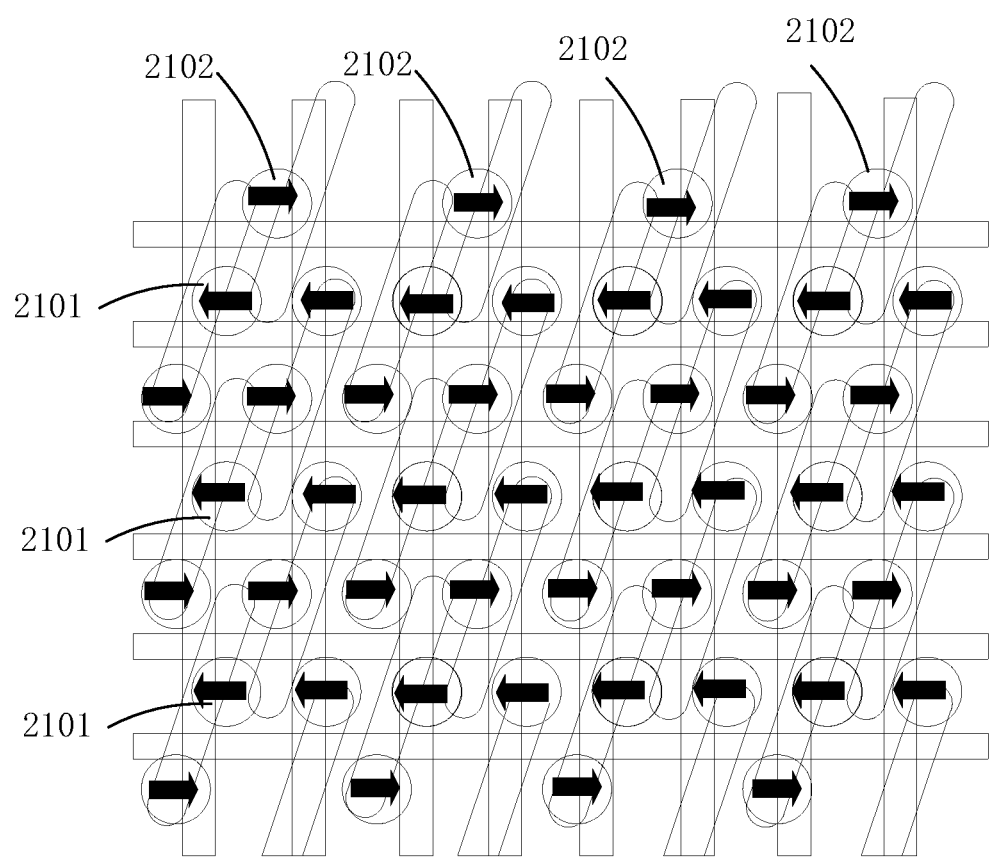
FIG. 3 is a schematic diagram of magnetization directions of a first magnetic domain wall and a second magnetic domain wall according to an exemplary embodiment.
Figure 12:
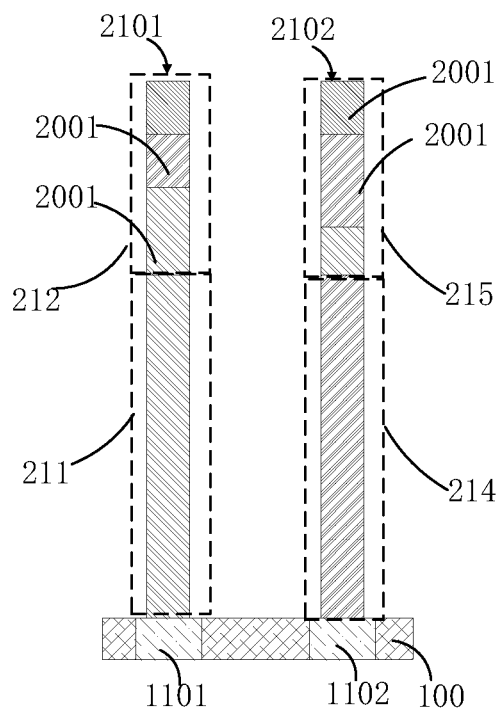
FIG. 12 is a cross-sectional view taken along C-C in FIG. 11.

As shown in FIG. 2 and FIG. 3 with reference to FIG. 12, the first magnetic domain wall 2101 and the second magnetic domain wall 2102 each have a plurality of magnetized segments 2001. Magnetization directions of the first magnetic domain wall 2101 and the second magnetic domain wall 2102 change depending on a magnetization direction of the magnetic tunnel junction 230. Moreover, a magnetization direction of the magnetized segment 2001 of the first magnetic domain wall 2101 is different from that of the magnetized segment 2001 of the second magnetic domain wall 2102. The first magnetic domain wall 2101 and the second magnetic domain wall 2102 each have a vertical magnetic field with a variable direction. The magnetization direction of the magnetized segment 2001 of the first magnetic domain wall 2101 is parallel to but opposite to the magnetization direction of the magnetized segment 2001 of the second magnetic domain wall 2102. In this embodiment, the term "vertical" means being perpendicular to the top surface of the substrate 100. The first magnetic domain wall 2101 and the second magnetic domain wall 2102 are connected through the magnetic track 220. The magnetic track 220 has a horizontal magnetic field with a variable direction. A plane in which the magnetic field is located is perpendicular to a plane in which the vertical magnetic field is located. A magnetization direction of the magnetic track 220 changes simultaneously with the magnetization direction of the first magnetic domain wall 2101 and the second magnetic domain wall 2102.

Referring to FIG. 2 and FIG. 12, along a direction moving away from the substrate 100, the first magnetic domain wall 2101 includes a first region 211 and a second region 212 arranged sequentially; the second magnetic domain wall 2102 includes a third region 214 and a fourth region 215 arranged sequentially. The first region 211 serves as a memory segment storing a logical value "0" and has a first length L1; the third region 214 serves as a memory segment storing a logical value "1" and has a second length L2. The second region 212, the magnetic track 220, and the fourth region 215 are sequentially connected to a flow region 213. The flow region 213 has a total length of L0. The magnetized segment 2001 located in the flow region 213 serves as a memory segment, and the memory segment stores a logical value "0" or "1".

Referring to FIG. 2 and FIG. 12, in the working process of the magnetic memory cell 200, when a current flows from the first region 211 to the third region 214, the current pushes the flow region 213 to move. That is, the flow region 213 moves along the flow direction of the current. Referring to FIG. 2, the memory segment for storing the logical value "0" in the flow region 213 flows towards the first region 211, and the memory segment for storing the logical value "1" in the flow region 213 moves towards the third region 214. To read integrated information stored in all the memory segments in the flow region 213, each memory segment in the flow region 213 needs to pass through the magnetic tunnel junction 230, such that the entire flow region 213 is read by the magnetic tunnel junction 230. Therefore, to ensure that the flow region 213 can be read by the magnetic tunnel junction 230, a sum of the first length L1 and the second length L2 should be greater than L0.

Referring to FIG. 2, a material of the first magnetic domain wall 2101 includes a magnetic material, a material of the second magnetic domain wall 2102 includes a magnetic material, and a material of the magnetic track 220 includes a magnetic material. For example, the magnetic material may be a ferromagnetic material, which may be selected from, but not limited to, the group consisting of the following materials: Permalloy, cobalt (Co), cobalt-iron-boron (CoFeB), Yttrium iron garnet (YIG), or the like.

As shown in FIG. 2, the magnetic free layer 231 and the magnetic reference layer 233 include magnetic materials containing different components. For example, the magnetic free layer 231 and the magnetic reference layer 233 may include ferromagnetic alloys containing different components. For example, the ferromagnetic alloy may be at least one selected from the group consisting of Ni, Fe, Co, Al, B, Mo, Hf, Pd, Pt, and Cu. In the vertical direction, the magnetization direction of the magnetic reference layer 233 is constantly maintained in one direction. Besides, when the external magnetic field or current changes, the magnetization direction of the magnetic reference layer 233 does not change significantly. The magnetization direction of the magnetic free layer 231 changes under the effect of the external magnetic field or current. A material of the non-magnetic spacing layer 232 includes an insulating material, such as oxide. For example, the material may include $AlO_x$ or MgO.

As shown in FIG. 2, the magnetic free layer 231 has a vertical magnetic field with a variable direction, and the magnetic reference layer 233 has a vertical magnetic field with a fixed direction. The magnetic free layer 231 has two stable magnetization directions, which are parallel to the magnetization direction of the magnetic reference layer 233. The two magnetization directions of the magnetic free layer 231 are the same as or opposite to the magnetization direction of the magnetic reference layer 233. When the magnetization direction of the magnetic free layer 231 is the same as the magnetization direction of the magnetic reference layer 233, a tunneling current between the magnetic reference layer 233 and the magnetic free layer 231 is high, and the magnetic tunnel junction 230 is in a low-resistance state. When the magnetization direction of the magnetic free layer 231 is opposite to the magnetization direction of the magnetic reference layer 233, the tunneling current between the magnetic reference layer 233 and the magnetic free layer 231 is low, and the magnetic tunnel junction 230 is in a high-resistance state.

As shown in FIG. 2, the selector 240 is provided with a spin-orbit torque effect. The selector 240 is configured to conduct or cut off the current, such that the current flowing through the surface of the selector 240 can generate a spin current in the vertical direction, thereby generating a torque in the vertical direction to turn over the magnetization direction of the magnetic free layer 231. For example, a material of the selector 240 includes a heavy metal material, such as nickel chromium (NiCr), cobalt-iron-boron (CoFeB), magnesium (Mg), hafnium (Hf), tantalum (Ta) or the like. Alternatively, the selector 240 may consist of multiple layers made of materials such as an oxide semiconductor, Mo, Ag, and TiN and heavy metals such as Pt, Pd, Ir, and Ru.

As shown in FIG. 1, the semiconductor structure further includes first write wires 300 extending along the first direction D1 and second write wires 400 extending along the second direction D2. The first write wire 300 is located above the magnetic tunnel junction 230. A plurality of magnetic tunnel junctions 230 are connected to the above first write wire 300 through the selectors 240. The second write wire 400 is located at a bottom of the magnetic tunnel junction 230, and a plurality of magnetic tunnel junctions 230 are connected to the bottom second write wire 400. The first write wire 300 and the second write wire 400 cross each other, and the magnetic tunnel junction 230 is arranged at a cross position of the first write wire 300 and the second write wire 400. The first write wire 300 is connected to a top surface of the selector 240.

In some embodiments, as shown in FIG. 1, the semiconductor structure further includes an insulating layer 500 located between the magnetic track 220 and the second write wire 400.

In the semiconductor structure of this embodiment, the magnetic memory cell 200 is connected to the sources 111 or drains 112 of different active regions 110. During a write operation, the magnetic memory cell 200 applies an external voltage to the first word line 121 and the second word line 122. The first word line 121 writes data into a plurality of magnetized segments 2001 of the first magnetic domain wall 2101, and the second word line 122 writes data into a plurality of magnetized segments 2001 of the second magnetic domain wall 2102. Under the effect of the external voltage, the first magnetic domain wall 2101 and the second magnetic domain wall 2102 generate vertical magnetic fields having opposite directions. The magnetic track 220 generates a horizontal magnetic field. Under the joint effect of the magnetic fields of the first magnetic domain wall 2101, the second magnetic domain wall 2102, and the magnetic track 220, the magnetized segments 2001 move along the direction of the magnetic field of the first magnetic domain wall 2101, the direction of the magnetic field of the magnetic track 220, and the direction of the magnetic field of the second magnetic domain wall 2102, such that a target magnetized segment is moved to the magnetic track 220 adjacent to the magnetic tunnel junction 230.

A current is applied to the first write wire 300, to generate a vertical spin current on the surface of the selector 240. The vertical spin current generates a vertical torque to turn over the magnetization direction of the magnetic free layer 231. The magnetic tunnel junction 230 switches from a low-resistance state to a high-resistance state, or from a high-resistance state to a low-resistance state. The magnetic memory cell 200 writes a value of the target magnetized segment into the magnetic memory cell 200.

Figure 4:
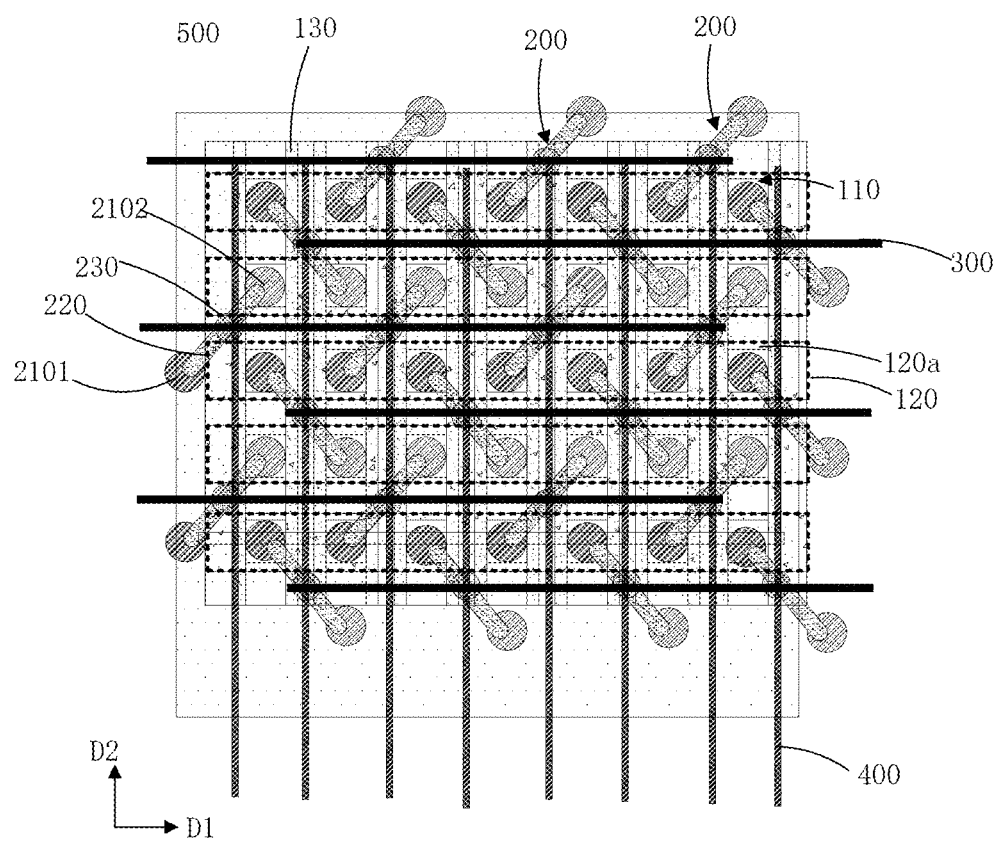
FIG. 4 is a top view of a semiconductor structure according to an exemplary embodiment.
Figure 5:
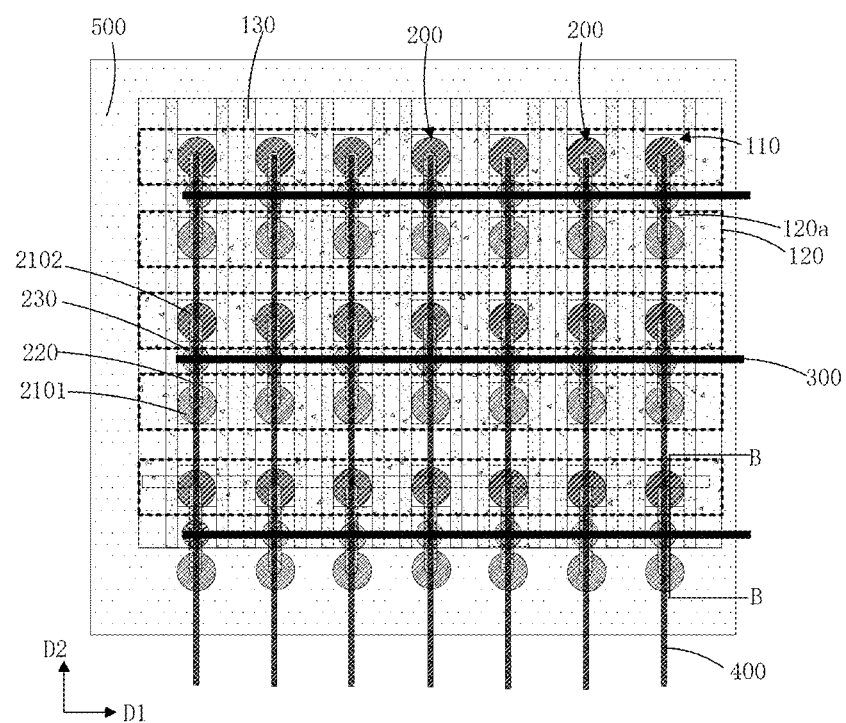
FIG. 5 is a top view of a semiconductor structure according to an exemplary embodiment.
Figure 6:
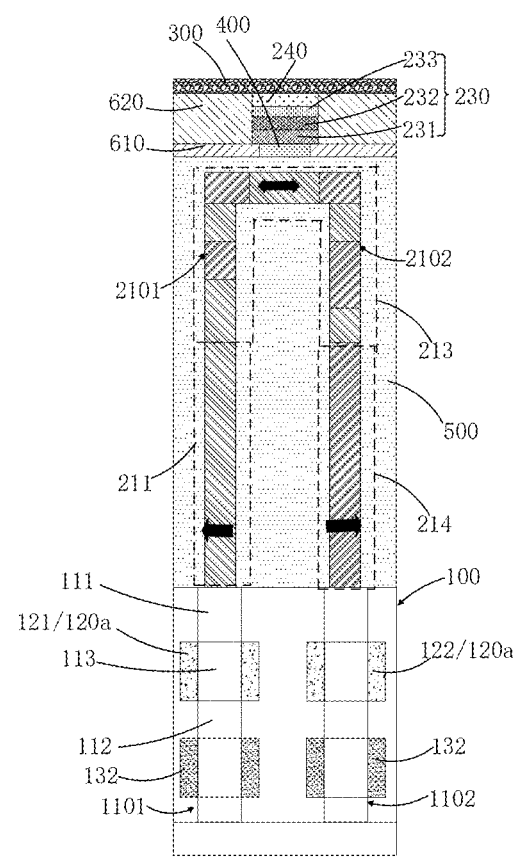
FIG. 6 is a cross-sectional view taken along B-B in FIG. 5.

An exemplary embodiment of the present disclosure provides a semiconductor structure. As shown in FIG. 4, FIG. 5, and FIG. 6 with reference to FIG. 20 and FIG. 21, the semiconductor structure includes a substrate 100, a word line 120, a bit line 130, and a magnetic memory cell 200. The substrate 100 includes active regions 110 arranged at intervals. The active region 110 is a columnar structure arranged on the substrate 100 perpendicularly, and the columnar structures are arranged in an array along a first direction D1 and a second direction D2. The word line 120 extends along the first direction D1 and covers parts of sidewalls of a plurality of columnar structures arranged along the first direction D1. The bit line 130 is located at the bottom of the columnar structure. The bit line 130 extends along the second direction D2 and covers parts of sidewalls of a plurality of active regions 110 arranged along the second direction D2. The first direction D1 intersects with the second direction D2. The magnetic memory cell 200 is arranged on the columnar structure.

As shown in FIG. 6, along the extension direction of the columnar structure, the active region 110 includes a drain 112 or source 111, a channel region 113, and a source 111 or drain 112 that are sequentially arranged. The word line 120 covers the channel region 113. The drain 112 or the source 111 is located on part of the columnar structure between the word line 120 and the bit line 130. The bit line 130 is connected to the drain 112 or source 111. The source 111 or drain 112 is located on part of the columnar structure above the word line 120. The word lines 120, the bit lines 130, and the active regions 110 form a gate-all-around (GAA) DRAM structure. Each active region 110 intersects with one word line 120 to form a transistor 140 correspondingly, and a part of each word line 120 act as gate 120a of the transistor 140.

Referring to FIG. 6, the magnetic memory cell 200 includes a first magnetic domain wall 2101, a second magnetic domain wall 2102, a magnetic track 220, a magnetic tunnel junction 230, and a selector 240. The first magnetic domain wall 2101 and the second magnetic domain wall 2102 are arranged parallel on the substrate 100. The magnetic track 220 is located on a top of the first magnetic domain wall 2101 and a top of the second magnetic domain wall 2102, and connects the first magnetic domain wall 2101 and the second magnetic domain wall 2102. The magnetic tunnel junction 230 is located above the magnetic track 220. The magnetic tunnel junction 230 and the magnetic track 220 are connected through magnetic induction. Along a direction away from the magnetic track 220, the magnetic tunnel junction 230 includes a magnetic free layer 231, a non-magnetic spacing layer 232, and a magnetic reference layer 233 that are sequentially arranged. The selector 240 is located on the magnetic tunnel junction 230, and the selector 240 is in contact connection with the magnetic reference layer 233.

As shown in FIG. 4, FIG. 5, and FIG. 6, the first magnetic domain wall 2101 of the magnetic memory cell 200 is arranged on a first active region 1101 in the plurality of active regions 110. The first active region 1101 intersects with the first word line 121. The first magnetic domain wall 2101 is connected to the first word line 121 through the source 111 or drain 112 of the first active region 1101. The second magnetic domain wall 2102 of the magnetic memory cell 200 is arranged on a second active region 1102 in the plurality of active regions 110. The second active region 1102 intersects with the second word line 122. The second magnetic domain wall 2102 is connected to the second word line 122 through the source 111 or drain 112 of the second active region 1102. The first word line 121 and the second word line 122 are not the same word line 120. Referring to FIG. 6, the first active region 1101 intersects with the first bit line 131, and the second active region 1102 intersects with the second bit line 132. The first bit line 131 and the second bit line 132 are not the same bit line 130.

As shown in FIG. 4 or FIG. 5, the semiconductor structure further includes first write wires 300 extending along the first direction D1 and second write wires 400 extending along the second direction D2. The first write wire 300 is located above the magnetic tunnel junction 230. A plurality of magnetic tunnel junctions 230 are connected to the above first write wire 300 through the selectors 240. The second write wire 400 is located at a bottom of the magnetic tunnel junction 230, and a plurality of magnetic tunnel junctions 230 are connected to the bottom second write wire 400. The first write wire 300 and the second write wire 400 cross each other, and the magnetic tunnel junction 230 is arranged at a cross position of the first write wire 300 and the second write wire 400. The first write wire 300 is connected to a top surface of the selector 240. The semiconductor structure further includes an insulating layer 500. The insulating layer 500 fills up a gap between the magnetic memory cells 200 and covers the magnetic track 220. The insulating layer 500 is arranged between the magnetic track 220 and the second write wire 400.

In the semiconductor structure of this embodiment, the magnetic memory cells 200 are arranged on the gate-all-around DRAM structure. The gate-all-around DRAM structure allows more transistors 140 to be arranged in a smaller region. The magnetic memory cells 200 are arranged more densely based on the gate-all-around DRAM structure.

Figure 7:
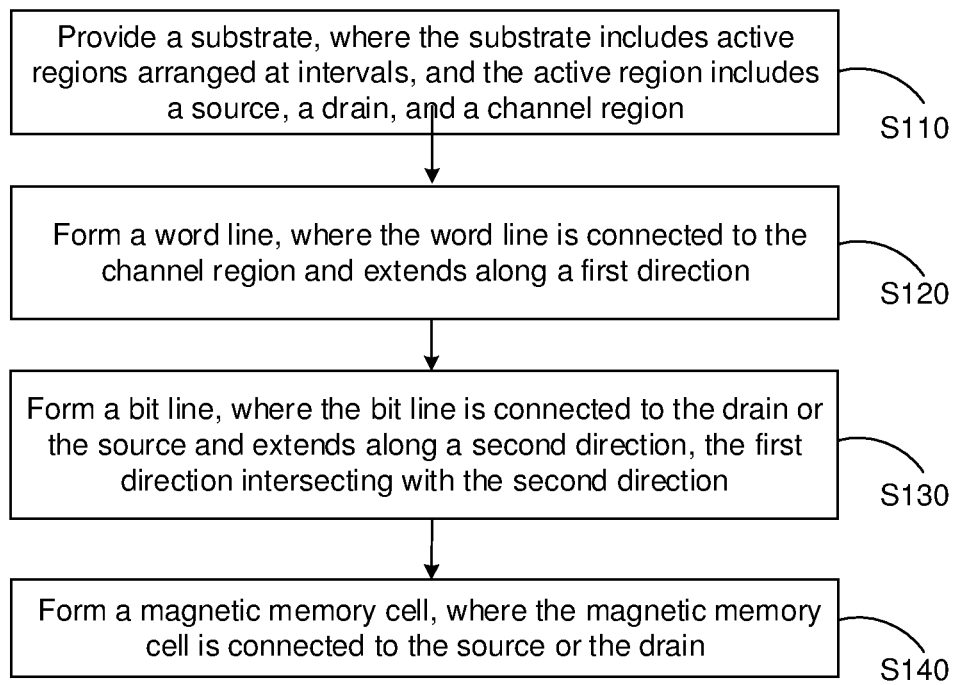
FIG. 7 is a flowchart of a method of manufacturing a semiconductor structure according to an exemplary embodiment.

An exemplary embodiment of the present disclosure provides a method of manufacturing a semiconductor structure. FIG. 7 is a flowchart of a method of manufacturing a semiconductor structure according to an exemplary embodiment of the present disclosure. FIG. 9 to FIG. 19 are schematic diagrams of various stages of the method of manufacturing a semiconductor structure according to this embodiment. The method of manufacturing a semiconductor structure is described below with reference to FIG. 9 to FIG. 19 in combination with FIG. 1 and FIG. 2. As shown in FIG. 7, the method of manufacturing a semiconductor structure in this embodiment includes the following steps:

Step S110: Provide a substrate, where the substrate includes active regions arranged at intervals, and the active region includes a source, a drain, and a channel region.

As shown in FIG. 9, the substrate 100 includes a plurality of independent active regions 110. Each active region 110 includes a source 111, a drain 112, and a channel region 113 located between the source 111 and the drain 112. The source 111 and the drain 112 have a first conductive type. The channel region 113 has a second conductive type opposite to the first conductive type. Each channel region 113 separates the source 111 and drain 112 of the active region 110. The substrate 100 further includes isolation structures (not shown in the figure). Adjacent active regions 110 are separated by the isolation structure. Each active region 110 includes two independent channel regions 113, a drain 112 or source 111 arranged between the two channel regions 113, and sources 111 or drains 112 at both ends of the active region 110.

A material of the active region 110 includes a semiconductor material, which may be silicon (Si), germanium (Ge), silicon germanium (GeSi), or silicon carbide (SiC). The semiconductor material may further be silicon-on-insulator (SOD, germanium-on-insulator (GOD, or other materials, for example, III-V group compounds such as gallium arsenide.

Step S120: Form a word line, where the word line is connected to the channel region and extends along a first direction.

As shown in FIG. 10, the word line 120 extends along the first direction D1 and covers the channel regions 113 of a plurality of active regions 110. Each word line 120 is connected to a plurality of channel regions 113 to form a plurality of transistors 140. A part of the word line 120 act as gate 120a of the transistor 140, and transistors 140 connected to a same word line 120 are driven by the same word line 120. Referring to FIG. 10, two transistors 140 are formed in each active region 110.

Step S130: Form a bit line, where the bit line is connected to the drain or the source and extends along a second direction, the first direction intersecting with the second direction.

As shown in FIG. 10, the bit line 130 extends along the second direction D2 and is connected to the drain 112 or source 111 of the active region 110. The word line 120, the bit line 130, and the active region 110 form a planar DRAM structure. In the planar DRAM structure, a transistor 140 is formed in each channel region 113 of the active region 110. The DRAM includes a plurality of transistors 140 arranged in an array.

Step S140: Form a magnetic memory cell, where the magnetic memory cell is connected to the source or the drain.

In this embodiment, the magnetic memory cell 200 is formed through the following steps:

Step S141: Form a magnetic material layer, where the magnetic material layer covers an exposed top surface of the active region.

The magnetic material layer (not shown in the figure) may be formed in the following manner: depositing a magnetic material through magnetron sputtering or arc ion plating (AIP), where the magnetic material covers the top surfaces of the active regions 110 (referring to FIG. 10), to form the magnetic material layer. The magnetic material may be a ferromagnetic material, which may be selected from, but not limited to, the group consisting of the following materials: Permalloy, cobalt (Co), cobalt-iron-boron (CoFeB), Yttrium iron garnet (YIG), or the like.

Step S142: Pattern the magnetic material layer to form a plurality of independent magnetic domain walls.

Figure 11:
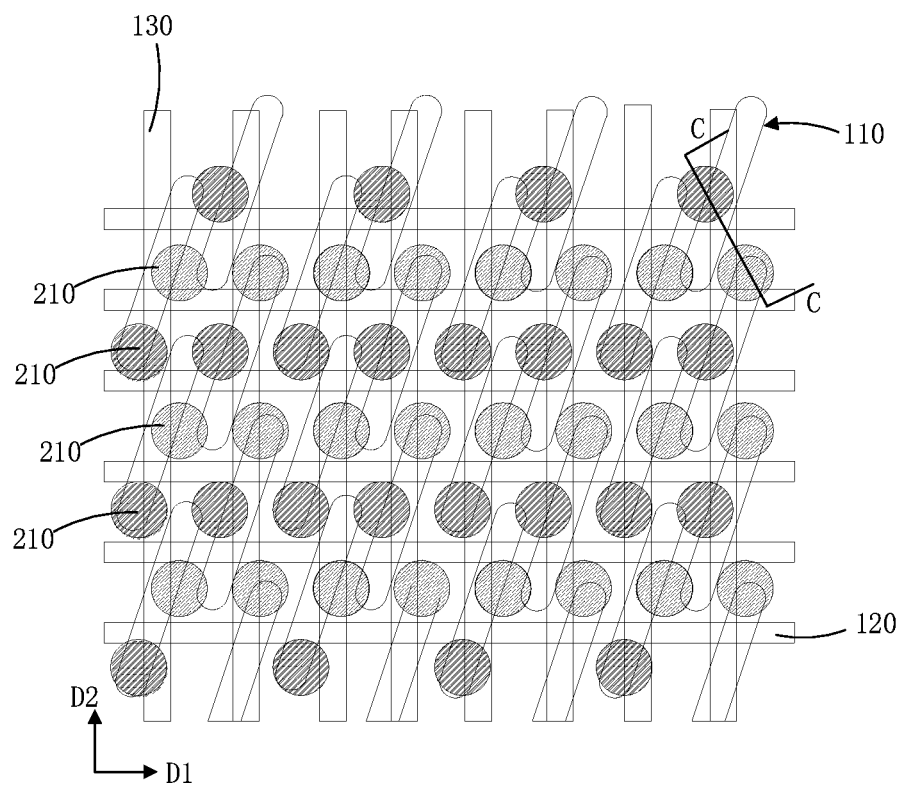
FIG. 11 is a schematic diagram of forming magnetic domain walls according to an exemplary embodiment.

As shown in FIG. 11 and FIG. 12 with reference to FIG. 10, the magnetic material layer may be patterned in the following manner: forming a mask on a top surface of the magnetic material layer, and etching to remove part of the magnetic material layer according to the mask, where a retained material layer forms a plurality of independent magnetic domain walls 210, and each magnetic domain wall 210 covers part of the top surface of the active region 110 and is connected to the source 111 of the active region 110. It is understandable that, in other embodiments, the magnetic domain wall 210 is connected to the drain 112 of the active region 110.

Step S143: Form a magnetic track, where the magnetic track is connected to a first magnetic domain wall and a second magnetic domain wall in the magnetic domain wall.

Figure 13:
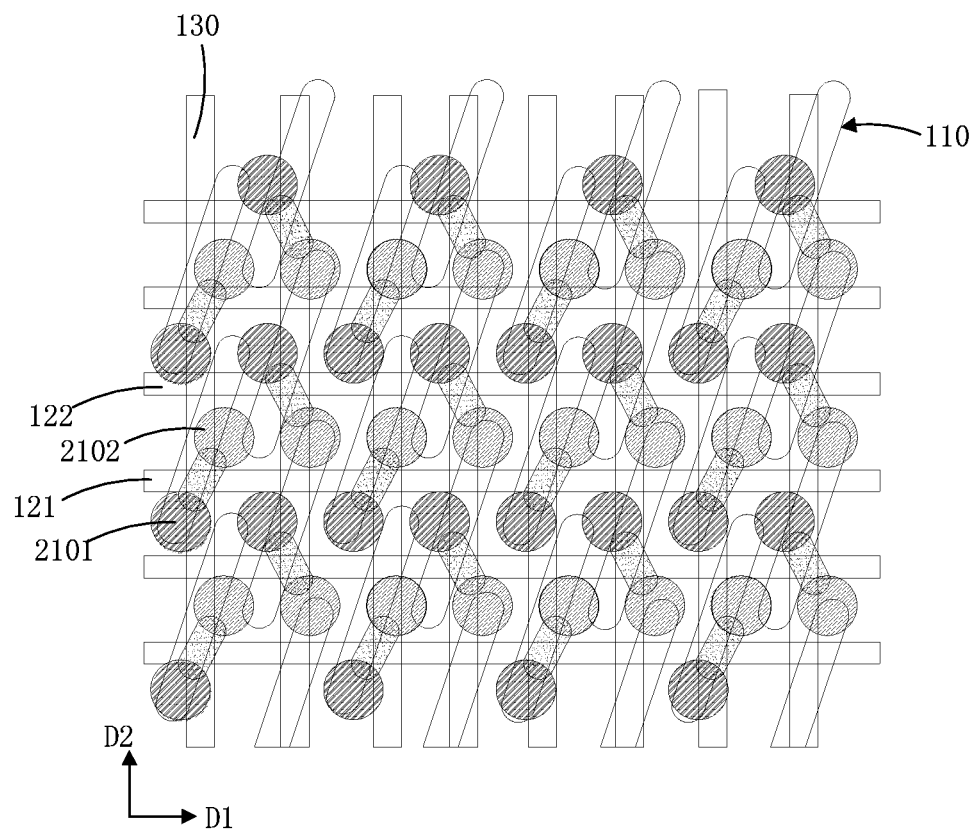
FIG. 13 is a schematic diagram of connecting a first magnetic domain wall and a second magnetic domain wall through a magnetic track according to an exemplary embodiment.

In this embodiment, projection patterns of the magnetic track 220, the first magnetic domain wall 2101, and the second magnetic domain wall 2102 on the substrate 100 are as shown in FIG. 13.

The magnetic track 220 is formed through the following steps:

First, as shown in FIG. 13 with reference to FIG. 11 and FIG. 12, the plurality of magnetic domain walls 210 are classified into first magnetic domain wall 2101 and second magnetic domain wall 2102, the first magnetic domain wall 2101 is connected to the first word line 121 in the word line 120, and the second magnetic domain wall 2102 is connected to the second word line 122 in the word line 120, the first word line 121 being different from the second word line 122. The first word line 121 and the second word line 122 in this embodiment mean that the first word line 121 and the second word line 122 are not the same word line 120. The first word line 121 and the second word line 122 are connected to the channel regions 113 of two adjacent active regions 110.

Then, as shown in FIG. 13, the magnetic track 220 is provided on the magnetic domain walls 210. The first magnetic domain wall 2101 and the second magnetic domain wall 2102 in the magnetic domain walls 210 are connected through the magnetic track 220.

Step S144: Form an insulating layer, where a gap between the first magnetic domain wall and the second magnetic domain wall is filled with the insulating layer, and the insulating layer covers a top surface of the magnetic track.

Figure 14:
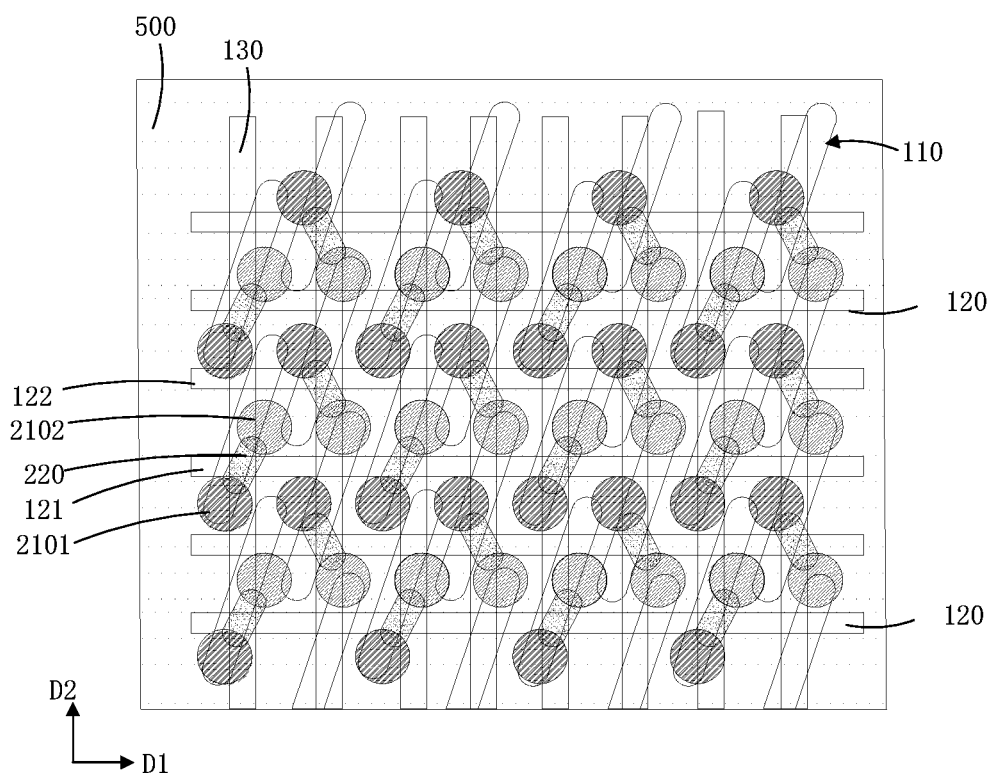
FIG. 14 is a schematic diagram of forming an insulating layer according to an exemplary embodiment.

In this implementation, as shown in FIG. 14, the insulating layer 500 may be formed in the following manner: depositing an insulating material through any one of the following deposition processes: chemical vapor deposition (CVD), physical vapor deposition (PVD), atomic layer deposition (ALD) or sputtering, where the insulating material fills up the gap between the first magnetic domain wall 2101 and the second magnetic domain wall 2102 and covers the top surface of the magnetic track 220 to form the insulating layer 500.

In this embodiment, after the insulating layer 500 is formed through deposition, the method further includes: processing the insulating layer 500 through chemical mechanical polishing (CMP), to make the top surface of the insulating layer 500 plane, to facilitate subsequent processes on the top surface of the insulating layer 500.

Step S145: Form a second write wire on the insulating layer, where the second write wire extends above the magnetic track along second direction.

Figure 15:
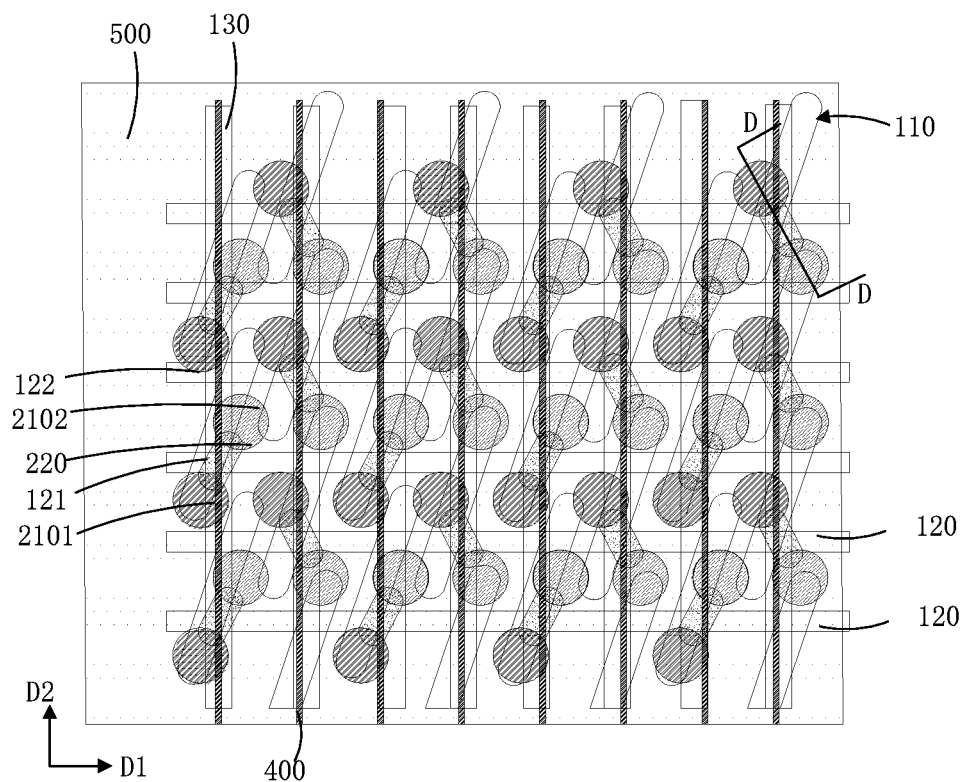
FIG. 15 is a schematic diagram of forming second write wires according to an exemplary embodiment.
Figure 16:
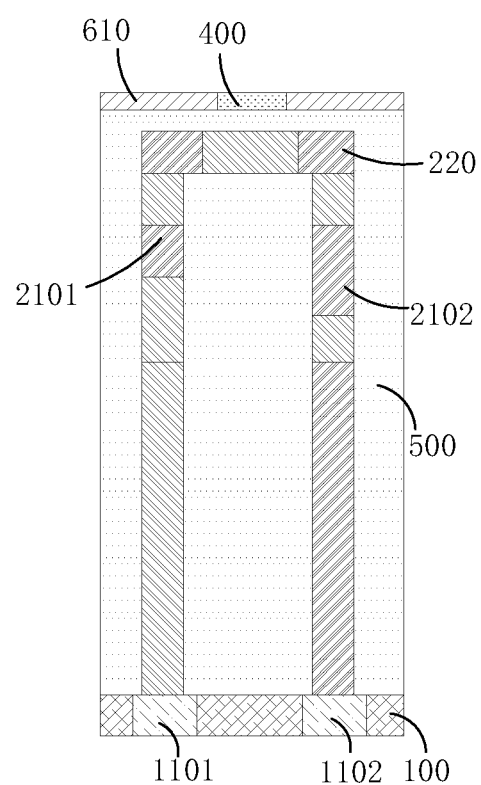
FIG. 16 is a cross-sectional view taken along D-D in FIG. 15.

As shown in FIG. 15 and FIG. 16 with reference to FIG. 14, the second write wire 400 extends along the second direction D2 and is located right above a plurality of magnetic tracks 220, and projection of each second write wire 400 on the substrate 100 overlaps with projection of the plurality of magnetic tracks 220 on the substrate 100.

As shown in FIG. 16, in this embodiment, after the second write wire 400 is formed, a dielectric layer material is deposited to fill up a groove between adjacent second write wires 400 and cover the top surfaces of the second write wires 400. Then, the dielectric material is etched back to expose the top surface of the second write wire 400 to form a first dielectric layer 610, where a top surface the first dielectric layer 610 is flush with the top surface of the second write wire 400, to facilitate subsequent processes on the top surfaces of the second write wires 400.

Step S146: Form a magnetic tunnel junction, where the magnetic tunnel junction is arranged on the second write wire, and projection of the magnetic tunnel junction on the substrate covers projection of the magnetic track on the substrate.

Figure 17:
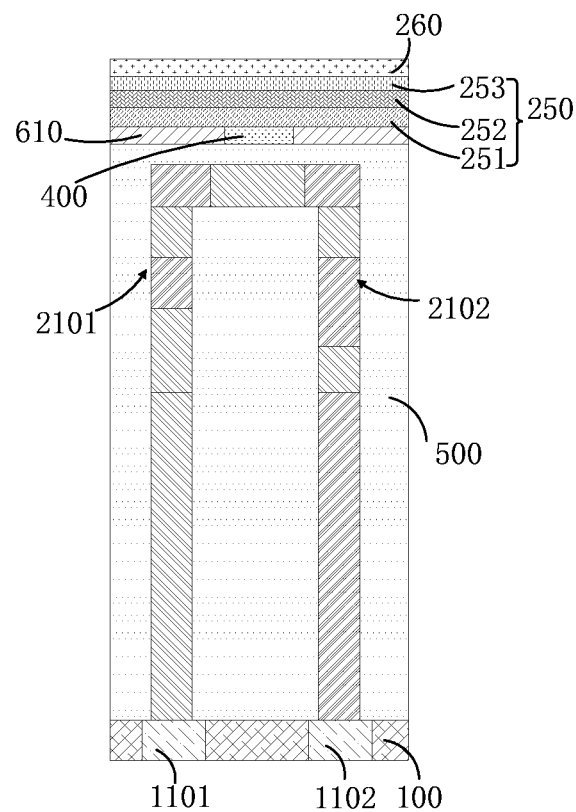
FIG. 17 is a cross-sectional view, taken along D-D, of forming a laminated structure and a selected material layer according to an exemplary embodiment.

In this embodiment, the magnetic tunnel junction 230 is formed through the following steps:

First, as shown in FIG. 17, a laminated structure 250 is formed, where the laminated structure 250 includes a first magnetic material layer 251, a non-magnetic material layer 252, and a second magnetic material layer 253 that are sequentially arranged on the second write wire 400.

For example, a first magnetic material may be deposited through magnetron sputtering or arc ion plating, to form a first magnetic material layer 251, where the first magnetic material layer 251 covers top surfaces of the first dielectric layer 610 and the second write wire 400. Then, a non-magnetic material is deposited through any one of the following processes: chemical vapor deposition, physical vapor deposition, atomic layer deposition or sputtering, to form a non-magnetic material layer 252. A material of the non-magnetic material layer 252 includes an insulating material, such as oxide. For example, the insulating material may include $AlO_x$ or MgO. Next, a second magnetic material is deposited through magnetron sputtering or arc ion plating, to form a second magnetic material layer 253. The second magnetic material layer 253 covers a top surface of the non-magnetic material layer 252. The first magnetic material and the second magnetic material may include a ferromagnetic alloy. For example, the ferromagnetic alloy may be at least one selected from the group consisting of Ni, Fe, Co, Al, B, Mo, Hf, Pd, Pt, and Cu.

Figure 18:
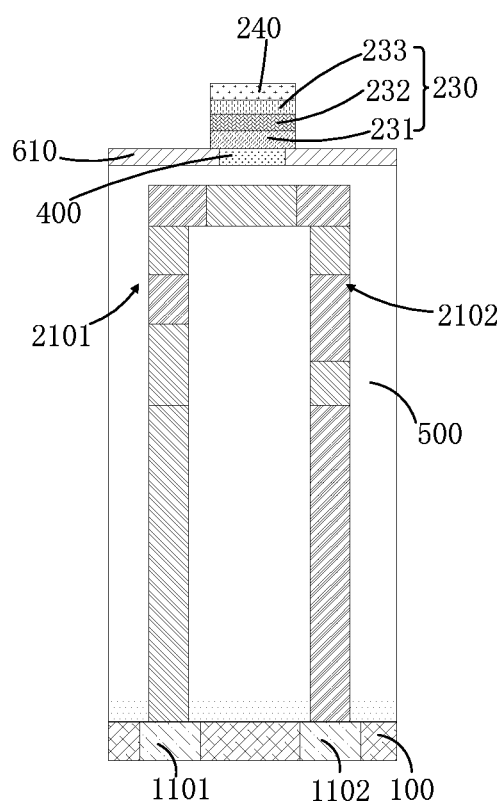
FIG. 18 is a cross-sectional view, taken along D-D, of forming a laminated structure and a selected material layer according to an exemplary embodiment.

Then, as shown in FIG. 18 with reference to FIG. 17, the laminated structure 250 is patterned. The second magnetic material layer 253, the non-magnetic material layer 252, and the first magnetic material layer 251 are sequentially etched. The laminated structure 250 is etched to form a plurality of independent magnetic tunnel junctions 230. The laminated structure 250 retained after etching forms a plurality of independent magnetic tunnel junctions 230. The magnetic tunnel junction 230 is arranged on the second write wire 400, and each magnetic tunnel junction 230 is correspondingly arranged right above one magnetic track 220. Along a direction away from the magnetic track 220, the magnetic tunnel junction 230 includes a magnetic free layer 231, a non-magnetic spacing layer 232, and a magnetic reference layer 233 that are sequentially arranged.

Step S147: Form a selector, where the selector covers a top surface of the magnetic tunnel junction.

In this embodiment, the selector 240 is formed through the following steps:

First, as shown in FIG. 17, a heavy metal material is deposited. In this embodiment, this step is performed after the foregoing step of forming a second magnetic material layer 253. A selected material layer 260 is formed through any one of the following deposition processes: chemical vapor deposition, physical vapor deposition, atomic layer deposition or sputtering, where the selected material layer 260 covers a top surface of the second magnetic material layer 253. A material of the selected material layer 260 includes heavy metal, such as nickel chromium (NiCr), cobalt-iron-boron (CoFeB), magnesium (Mg), hafnium (Hf), tantalum (Ta) or the like.

Then, as shown in FIG. 18 with reference to FIG. 17, the selected material layer 260 is etched to form a plurality of independent selectors 240. The plurality of selectors 240 correspondingly cover the top surfaces of the plurality of magnetic tunnel junctions 230. In this embodiment, the step of etching the selected material layer 260 and the step of patterning the laminated structure 250 are formed at the same time, to ensure that the formed selector 240 covers the top surface of the magnetic tunnel junction 230.

Figure 19:
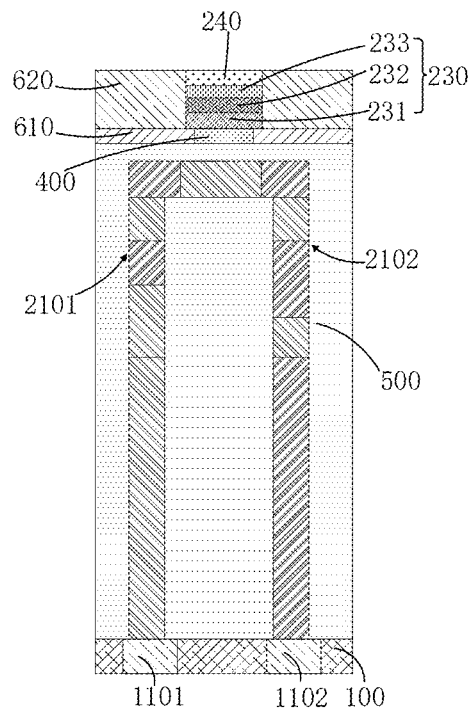
FIG. 19 is a cross-sectional view, taken along D-D, of forming a second dielectric layer according to an exemplary embodiment.

In this embodiment, as shown in FIG. 19, after the selector 240 is formed, the method further includes: forming a second dielectric layer 620 through deposition, where a gap between the magnetic tunnel junctions 230 and a gap between the selector 240 is filled with the second dielectric layer 620, and a top surface of the second dielectric layer 620 is flush with the top surface of the selector 240, to facilitate the manufacturing process of the first write wire 300 on the second dielectric layer 620 and the selector 240 (which is described in detail in the following step).

Step S148: Form a first write wire, where the first write wire extends above the magnetic tunnel junction along the first direction, and the first write wire covers part of a top surface of the selector.

As shown in FIG. 1 and FIG. 2, the first write wire 300 extends along the first direction D1, and each first write wire 300 covers parts of top surfaces of a plurality of selectors 240. In the second direction D2, a width of the first write wire 300 is greater than a width of the selector 240. Projection of the first write wire 300 on the substrate 100 overlaps with projection of a plurality of selectors 240 on the substrate 100.

In the method of manufacturing this embodiment, the word line, bit lines, and active regions form a DRAM structure, and the magnetic memory cells are formed on the DRAM structure. Transistors of the DRAM structure are used as transistors for controlling write and read operations of the magnetic memory cell, which simplifies the manufacturing process of the magnetic memory cell. Moreover, the magnetic memory cells are arranged based on an arrangement rule of the DRAM structure, thereby improving the arrangement density of the magnetic memory cells.

Figure 8:
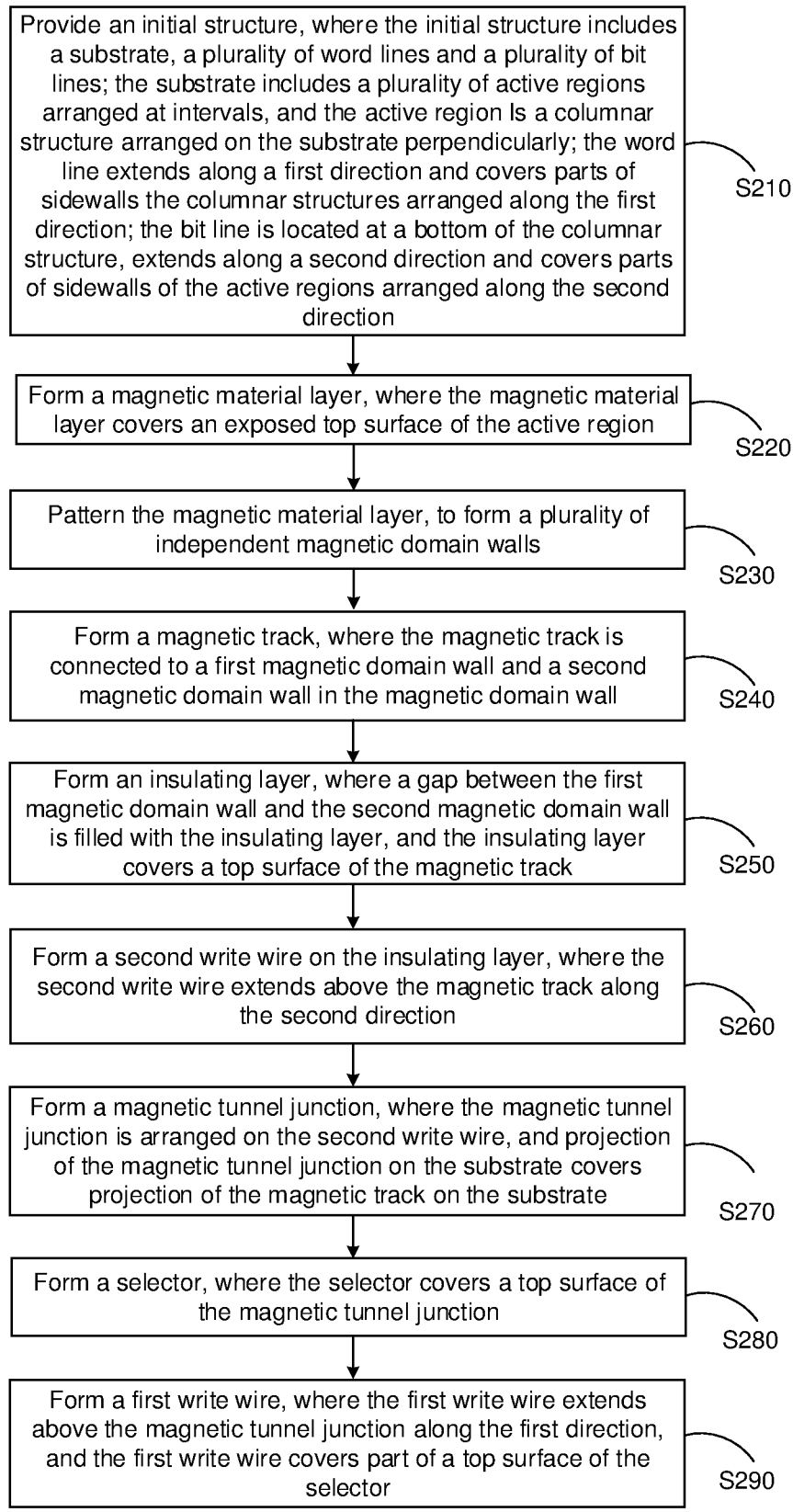
FIG. 8 is a flowchart of the method of manufacturing a semiconductor structure according to an exemplary embodiment.
Figure 20:
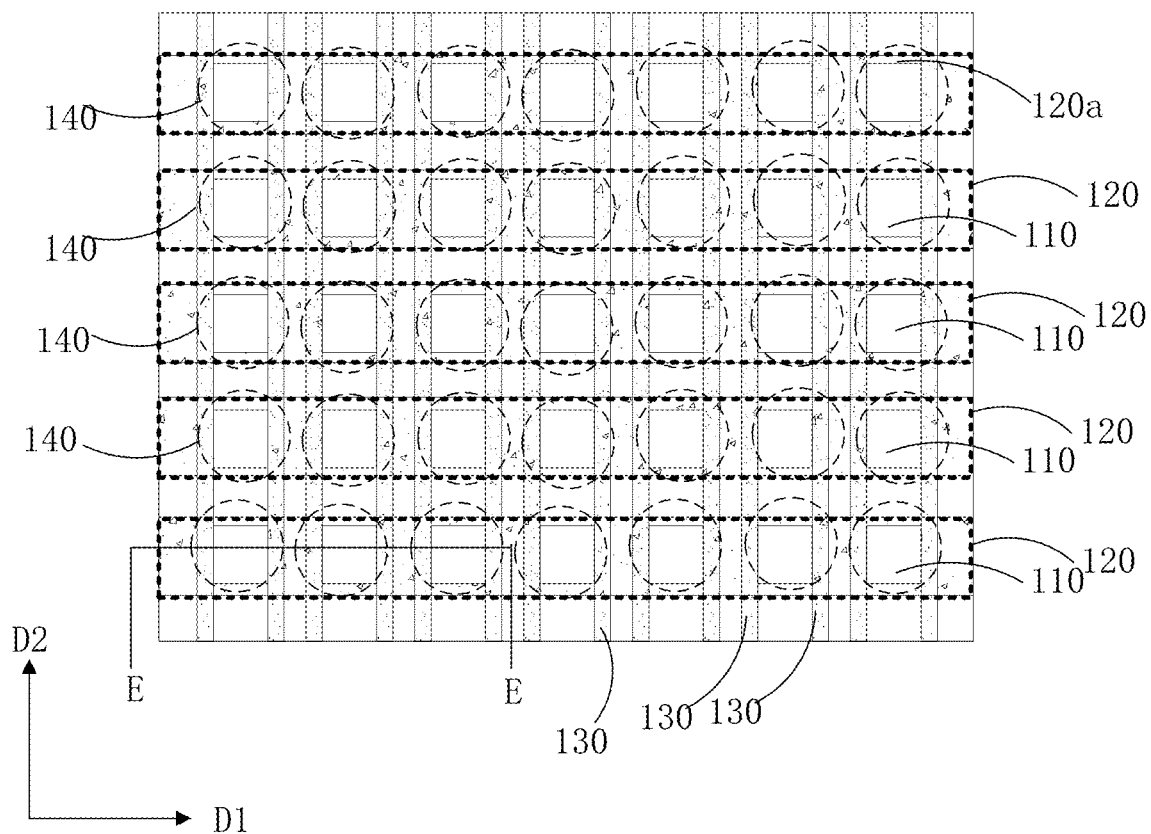
FIG. 20 is a schematic diagram of forming word lines and bit lines according to an exemplary embodiment.
Figure 21:
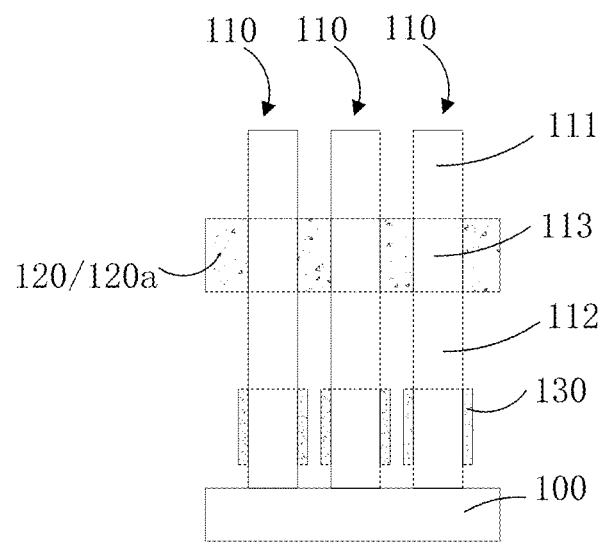
FIG. 21 is a cross-sectional view taken along E-E in FIG. 20.

An exemplary embodiment of the present disclosure provides a method of manufacturing a semiconductor structure. FIG. 8 is a flowchart of a method of manufacturing a semiconductor structure according to an exemplary embodiment of the present disclosure. FIG. 20 to FIG. 21 are schematic diagrams of various stages of the method of manufacturing a semiconductor structure according to this embodiment. The method of manufacturing a semiconductor structure is described below with reference to FIG. 20 to FIG. 21 in combination with FIG. 4 to FIG. 6. As shown in FIG. 8, the method of manufacturing a semiconductor structure in this embodiment includes the following steps:

Step S210: Provide an initial structure, where the initial structure includes a substrate, a plurality of word lines and a plurality of bit lines; the substrate includes a plurality of active regions arranged at intervals, and the active region is a columnar structure arranged on the substrate perpendicularly; the word line extends along a first direction and covers parts of sidewalls the columnar structures arranged along the first direction; the bit line is located at a bottom of the columnar structure, extends along a second direction and covers parts of sidewalls of the active regions arranged along the second direction.

As shown in FIG. 20 and FIG. 21, the initial structure 1 is a gate-all-around DRAM structure. Each active region 110 intersects with one word line 120 to form a transistor 140 correspondingly, and a part of each word line 120 act as gate 120a of the transistor 140. A material of the active region 110 is the same as that of the active region 110 in the foregoing embodiment.

As shown in FIG. 20 and FIG. 21, the plurality of active regions 110 are arranged in an array along the first direction D1 and the second direction D2, the first direction D1 and the second direction D2 intersecting with each other at a predetermined angle. Along the extension direction of the columnar structure, each active region 110 includes a drain 112 or source 111, a channel region 113, and a source 111 or drain 112 that are sequentially arranged. The word line 120 covers the channel region 113. The drain 112 or the source 111 is located on part of the columnar structure between the word line 120 and the bit line 130. The bit line 130 is connected to the drain 112 or source 111. The source 111 or drain 112 is located on part of the columnar structure above the word line 120. The word lines 120, the bit lines 130, and the active regions 110 form a gate-all-around DRAM structure. Each active region 110 intersects with one word line 120 to form a transistor 140 correspondingly.

Step S220: Form a magnetic material layer, where the magnetic material layer covers an exposed top surface of the active region.

Step S230: Pattern the magnetic material layer, to form a plurality of independent magnetic domain walls.

Step S240: Form a magnetic track, where the magnetic track is connected to a first magnetic domain wall and a second magnetic domain wall in the magnetic domain wall.

Figure 22:
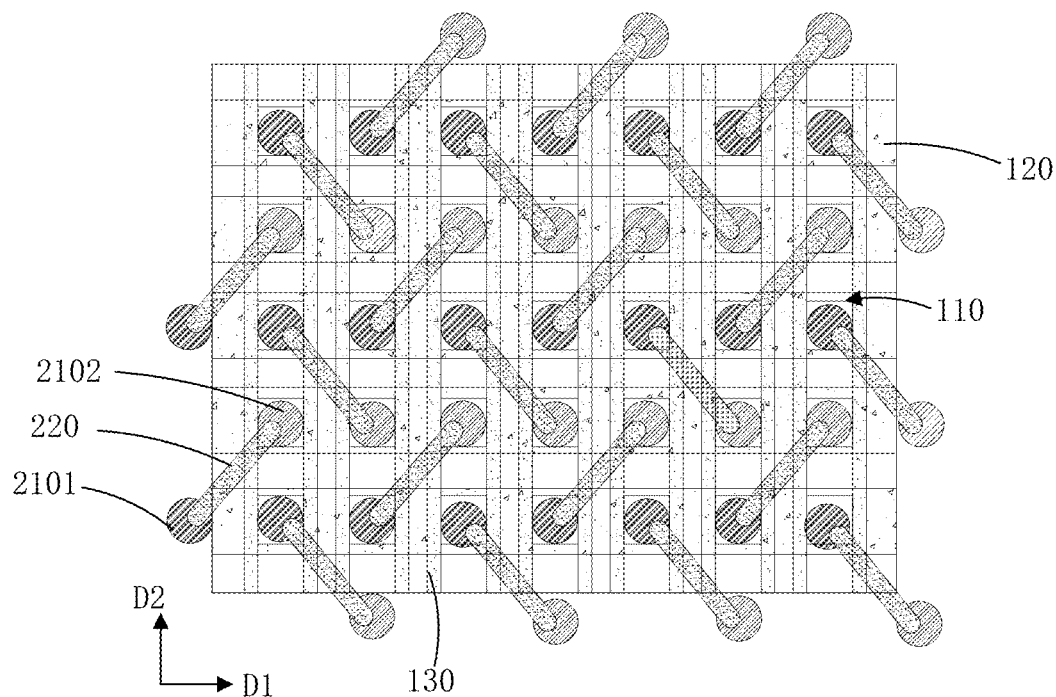
FIG. 22 is a schematic diagram of connecting a first magnetic domain wall and a second magnetic domain wall through a magnetic track according to an exemplary embodiment.
Figure 23:
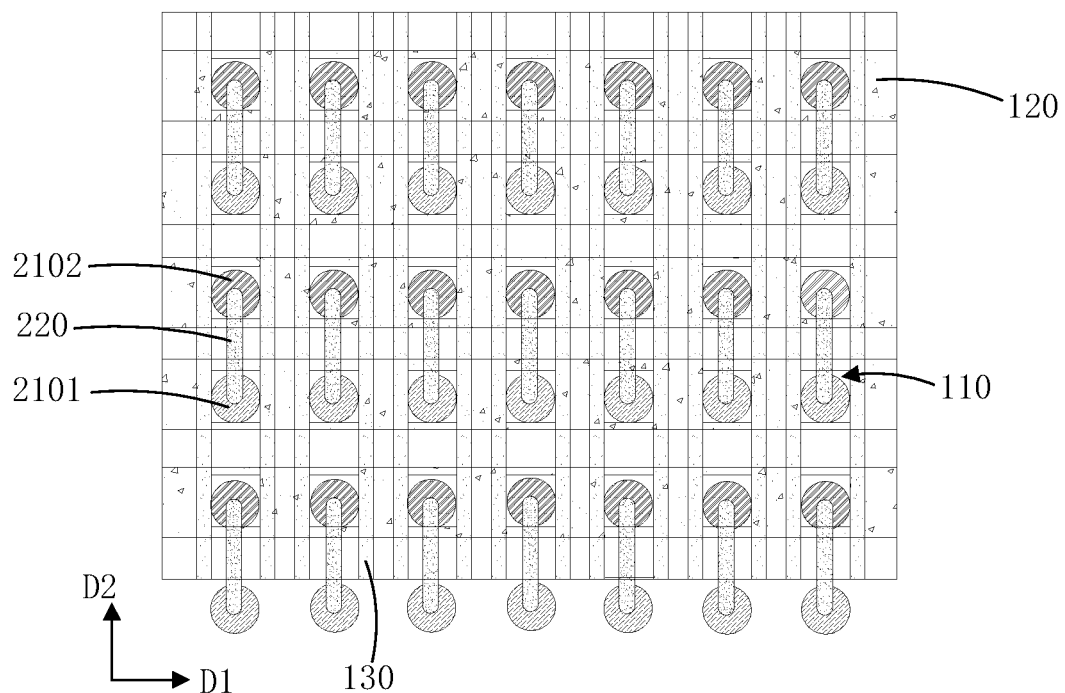
FIG. 23 is a schematic diagram of connecting a first magnetic domain wall and a second magnetic domain wall through a magnetic track according to an exemplary embodiment.

As shown in FIG. 22 and FIG. 23 with reference to FIG. 6, in this embodiment, the first magnetic domain wall 2101 of the magnetic memory cell 200 is arranged on the first active region 1101 and is connected to the first word line 121 through the first active region 1101. The second magnetic domain wall 2102 is arranged on the second active region 1102, and is connected to the second word line 122 through the second active region 1102. The first active region 1101 and the second active region 1102 are two adjacent active regions 110; the first word line 121 and the second word line 122 are not the same word line 120. The first active region 1101 intersects with the first bit line 131, and the second active region 1102 intersects with the second bit line 132. The first bit line 131 and the second bit line 132 are not the same bit line 130.

Step S250: Form an insulating layer, where a gap between the first magnetic domain wall and the second magnetic domain wall is filled with the insulating layer, and the insulating layer covers a top surface of the magnetic track.

Step S260: Form a second write wire on the insulating layer, where the second write wire extends above the magnetic track along the second direction.

Step S270: Form a magnetic tunnel junction, where the magnetic tunnel junction is arranged on the second write wire, and projection of the magnetic tunnel junction on the substrate covers projection of the magnetic track on the substrate.

Step S280: Form a selector, where the selector covers a top surface of the magnetic tunnel junction.

Step S290: Form a first write wire, where the first write wire extends above the magnetic tunnel junction along the first direction, and the first write wire covers part of a top surface of the selector.

The implementation of step S220 to step S290 in this embodiment is the same as that of step S141 to step S148 in the foregoing embodiment. Details are not described herein again.

As shown in FIG. 4, FIG. 5, and FIG. 6, in the method of manufacturing this embodiment, magnetic memory cells are arranged on the gate-all-around DRAM structure. Transistors of the gate-all-around DRAM structure are used as transistors for controlling read and write operations of the magnetic memory cell, which simplifies the manufacturing process of the magnetic memory cell. Moreover, the magnetic memory cells formed on the gate-all-around DRAM structure are denser, which can further improve the arrangement density of the magnetic memory cell.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A semiconductor structure, comprising:
   a substrate, comprising active regions arranged at intervals, wherein each active region comprises a source, a drain, and a channel region;
   a plurality of word lines, wherein each word line is located adjacent to corresponding channel regions and extends along a first direction;
   a bit line, wherein the bit line is connected to the drain or the source and extends along a second direction, the first direction intersecting with the second direction; and
   a magnetic memory cell, wherein the magnetic memory cell is connected to the source or the drain, wherein the magnetic memory cell comprises a first magnetic domain wall connected to a first word line in the plurality of word lines, and a second magnetic domain wall connected to a second word line in the plurality of word lines, wherein the first word line is different from the second word line.

2. The semiconductor structure according to claim 1, wherein the word line is arranged in the active region, and two adjacent word lines of the plurality of word lines are located in a corresponding active region of the active regions and divide the corresponding active region into the source or the drain; and
   the bit line is arranged on a surface of the substrate and is connected to the drain or the source between the two adjacent word lines.

3. The semiconductor structure according to claim 1, wherein each active region is a columnar structure, and columnar structures are arranged along the first direction and the second direction;
   each word line covers sidewalls of the corresponding channel regions arranged along the first direction; and
   the bit line is located at a bottom of the columnar structure and is connected to a plurality of corresponding columnar structures arranged along the second direction.

4. The semiconductor structure according to claim 1, wherein the first word line and the second word line are connected to different active regions respectively.

5. The semiconductor structure according to claim 4, wherein the first magnetic domain wall is connected to the source or drain connected with the first word line, and the second magnetic domain wall is connected to the source or drain connected with the second word line.

6. The semiconductor structure according to claim 1, wherein the magnetic memory cell further comprises:
   a magnetic track, wherein the magnetic track is located at a top of the first magnetic domain wall and a top of the second magnetic domain wall and connects the first magnetic domain wall and the second magnetic domain wall;
   a magnetic tunnel junction, wherein the magnetic tunnel junction is located above the magnetic track, the magnetic tunnel junction and the magnetic track are connected through magnetic induction, and along a direction away from the magnetic track, the magnetic tunnel junction comprises a magnetic free layer, a non-magnetic spacing layer, and a magnetic reference layer that are sequentially arranged; and
   a selector, wherein the selector is located on the magnetic tunnel junction and is in contact connection with the magnetic reference layer.

7. The semiconductor structure according to claim 6, wherein the magnetic free layer has a vertical magnetic field with a variable direction, and the magnetic reference layer has a vertical magnetic field with a fixed direction.

8. The semiconductor structure according to claim 7, wherein the first magnetic domain wall and the second magnetic domain wall each have a magnetized segment, and a magnetization direction of the magnetized segment of the first magnetic domain wall is different from a magnetization direction of the magnetized segment of the second magnetic domain wall.

9. The semiconductor structure according to claim 6, further comprising:
   a first write wire, wherein the first write wire extends along the first direction and is located above the magnetic tunnel junction, and a plurality of magnetic tunnel junctions are connected to the above first write wire through the selector; and
   a second write wire, wherein the second write wire extends along the second direction and is located at a bottom of the magnetic tunnel junction, and a plurality of the magnetic tunnel junctions are connected to the bottom second write wire.

10. The semiconductor structure according to claim 9, wherein the first write wire and the second write wire cross each other, and the magnetic tunnel junction is arranged at a cross position between the first write wire and the second write wire.

11. The semiconductor structure according to claim 10, further comprising an insulating layer located between the magnetic track and the second write wire.

* * * * *